United States Patent
Young et al.

(10) Patent No.: US 7,212,075 B2
(45) Date of Patent: May 1, 2007

(54) DOWNHOLE CLOCK HAVING TEMPERATURE COMPENSATION

(75) Inventors: David J. Young, Houston, TX (US); Carl A. Robbins, Houston, TX (US); Eugene Linyaev, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 125 days.

(21) Appl. No.: 10/622,557

(22) Filed: Jul. 18, 2003

(65) Prior Publication Data

US 2005/0012561 A1      Jan. 20, 2005

(51) Int. Cl.
*H03B 5/32*           (2006.01)
(52) U.S. Cl. ............................ 331/176; 331/2; 331/158
(58) Field of Classification Search ................ 331/162, 331/176, 66, 56, 163, 37; 310/361, 315
See application file for complete search history.

(56) References Cited

U.S. PATENT DOCUMENTS

| 3,826,931 | A | * | 7/1974 | Hammond | 310/361 |
| 3,879,992 | A | * | 4/1975 | Bartera | 73/24.01 |
| 4,227,182 | A | * | 10/1980 | Ogasawara et al. | 340/870.37 |
| 4,325,036 | A | * | 4/1982 | Kuwabara | 331/176 |
| 5,200,714 | A | * | 4/1993 | Hayashi | 331/66 |
| 6,831,525 | B1 | * | 12/2004 | Beaudin et al. | 331/176 |
| 2002/0125966 | A1 | | 9/2002 | Gunawardana et al. | |

OTHER PUBLICATIONS

"Quartz Crystal Resonators and Oscillators, For Frequency Control and Timing Applications, A tutorial" John R. Vig, SLCET-TR-88-1 (Rev. 8.4.3.) (23 pp.).

* cited by examiner

*Primary Examiner*—Joseph Chang
(74) *Attorney, Agent, or Firm*—Conley Rose, P.C.

(57) ABSTRACT

A downhole crystal-based clock that is substantially insensitive to the factors that may cause frequency deviation as a result of downhole temperature. The clock may include a plurality of crystals, where a first crystal may be more stable, with respect to temperature, than a second crystal. The crystals may be thermally coupled together so that they may have substantially the same temperature. An error detector may monitor the differences between the frequencies associated with each crystal and provide this information to a storage device. This information may be determined prior to deploying the clock downhole. When deployed downhole, the signal from the error detector may be interpreted in light of the information in the storage device to provide a temperature measurement of the two crystals. The downhole temperature measurement then may be used to reduce frequency deviations in the downhole clock that may result from downhole temperatures.

23 Claims, 6 Drawing Sheets

DOWNHOLE CLOCK HAVING TEMPERATURE COMPENSATION

CROSS-REFERENCE TO RELATED APPLICATIONS

This application is related to application Ser. No. 10/453,411, filed: Jun. 3, 2003 titled, "Method and System for Downhole Clock" which is incorporated by reference herein as if reproduced in full below.

STATEMENT REGARDING FEDERALLY SPONSORED RESEARCH OR DEVELOPMENT

Not applicable.

BACKGROUND OF THE INVENTION

1. Field of the Invention

The preferred embodiments relate to well logging. More particularly, the preferred embodiments relate to generating a downhole clock for improving data measurements taken during logging.

2. Description of the Related Art

Modern petroleum drilling and production operations demand a great quantity of information relating to parameters and conditions downhole. Such information may include characteristics of the earth formations traversed by the wellbore, along with data relating to the size and configuration of the borehole itself. The collection of information relating to conditions downhole, which commonly is referred to as "logging," may be performed by several methods.

In conventional wireline logging, a probe or "sonde," housing formation sensors, may be lowered into the borehole after some or all of the well has been drilled. Once in the borehole, the sonde may be used to determine characteristics of the borehole, as well as formations traversed by the borehole. The upper end of the sonde may be attached to a wireline that suspends the sonde in the borehole. Power may be transmitted to the sensors and instrumentation in the sonde through the wireline. Similarly, the instrumentation in the sonde may communicate information to the surface by electrical signals transmitted through the wireline.

An alternative method of logging involves the collection of data during the drilling process. Collecting and processing data during the drilling process eliminates the necessity of removing or tripping the drilling assembly to insert a wireline logging tool. Accordingly, drilling techniques may be modified during drilling in order to optimize performance while minimizing down time. Measuring conditions downhole, including the movement and location of the drilling assembly, contemporaneously with the drilling of the well have come to be known as "measurement-while-drilling" techniques, or "MWD." Similar techniques, concentrating more on the measurement of formation parameters, commonly have been referred to as "logging-while-drilling" techniques, or "LWD." For the purposes of this disclosure, the term LWD will be used with the understanding that this term encompasses both the collection of formation parameters and the collection of information relating to the movement and position of the drilling assembly.

Sensors or transducers may be located at the lower end of the drillstring in LWD systems. During drilling, these sensors may continuously or intermittently monitor drilling parameters and formation data. In some circumstances, energy sources for measurements, such as acoustic noise sources, may be located proximate to sensors on the drillstring. In other circumstances, the energy sources may be located elsewhere, such as seismic sources at the surface or within other boreholes. In order to retrieve useful information from received signals, it may be necessary to measure the elapsed time between when the signal emanates from the source, and reception by the downhole sensor. Thus, each datum received may be associated with an instant of time—i.e., time-stamped—based on a downhole clock in LWD operations.

If the source energy originated from downhole, the transmission time and arrival time may be correlated by the same downhole clock. In some systems, however, the energy may originate from the surface (or other location), and a second surface clock may also be used. As a consequence of using two clocks, synchronization between the two clocks may be important in order to obtain accurate LWD data. The two clocks may be in a non-synchronous state for a variety of reasons. For example, the surface clock may be a highly accurate time source, such as a GPS disciplined clock, while the downhole clock may vary according to its operating conditions, such as downhole temperature.

U.S. patent application number 2002/0125966A1 to Gunawardana et al. (hereinafter '966 patent) may disclose a downhole clock with improved temperature behavior. The clock in the '966 patent may be based on a single crystal that operates simultaneously in two modes of oscillation. A first mode of oscillation produces a frequency that may be somewhat independent of temperature, and a second mode of oscillation produces a frequency that may be somewhat dependent on temperature. The ratio between the frequencies over a range of temperatures may be used to compensate for fluctuations in the oscillation frequency of the first mode of oscillation. Because a single crystal is used, the temperature sensitivity of the oscillation frequencies may be inadequate for their intended purpose. For example, the difference, with respect to temperature, between the frequency associated with the first mode of oscillation and the frequency associated with the second mode of oscillation may be too small to provide the required level of sensitivity to accurately compensate changes in frequency.

BRIEF SUMMARY OF SOME OF THE PREFERRED EMBODIMENTS

Accordingly, there is disclosed herein a method and apparatus for a downhole clock that is substantially insensitive to frequency deviations resulting from downhole temperatures. In some embodiments, the downhole clock may include at least two crystals. Using two crystals may be advantageous because each crystal's behavior, with respect to temperature, may be selected independent of the other. The crystals may include a first crystal whose frequency of oscillation varies only slightly with temperature variations and a second crystal whose frequency of oscillation varies within an amount greater than that of the first crystal. A relationship between the first and the second crystal's behavior with respect to temperature may be developed and stored. The relationship may be utilized to compensate the downhole clock for frequency variations stemming from downhole temperatures. Because the first and second crystals may be independently selected, the difference in their frequency behavior with respect to temperature may be selected to achieve a variance in temperature response that allows for greater overall frequency stability after correction.

BRIEF DESCRIPTION OF THE DRAWINGS

A better understanding of the present invention can be obtained when the following detailed description of the preferred embodiment is considered in conjunction with the following drawings, in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

NOTATION AND NOMENCLATURE

Certain terms are used throughout the following description and claims to refer to particular system components. This document does not intend to distinguish between components that differ in name but not function.

In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical, mechanical, or thermal connection. Thus, if a first device couples to a second device, that connection may be through a direct connection, or through an indirect connection via other devices and connections.

DETAILED DESCRIPTION OF THE PREFERRED EMBODIMENTS

Figure 1:
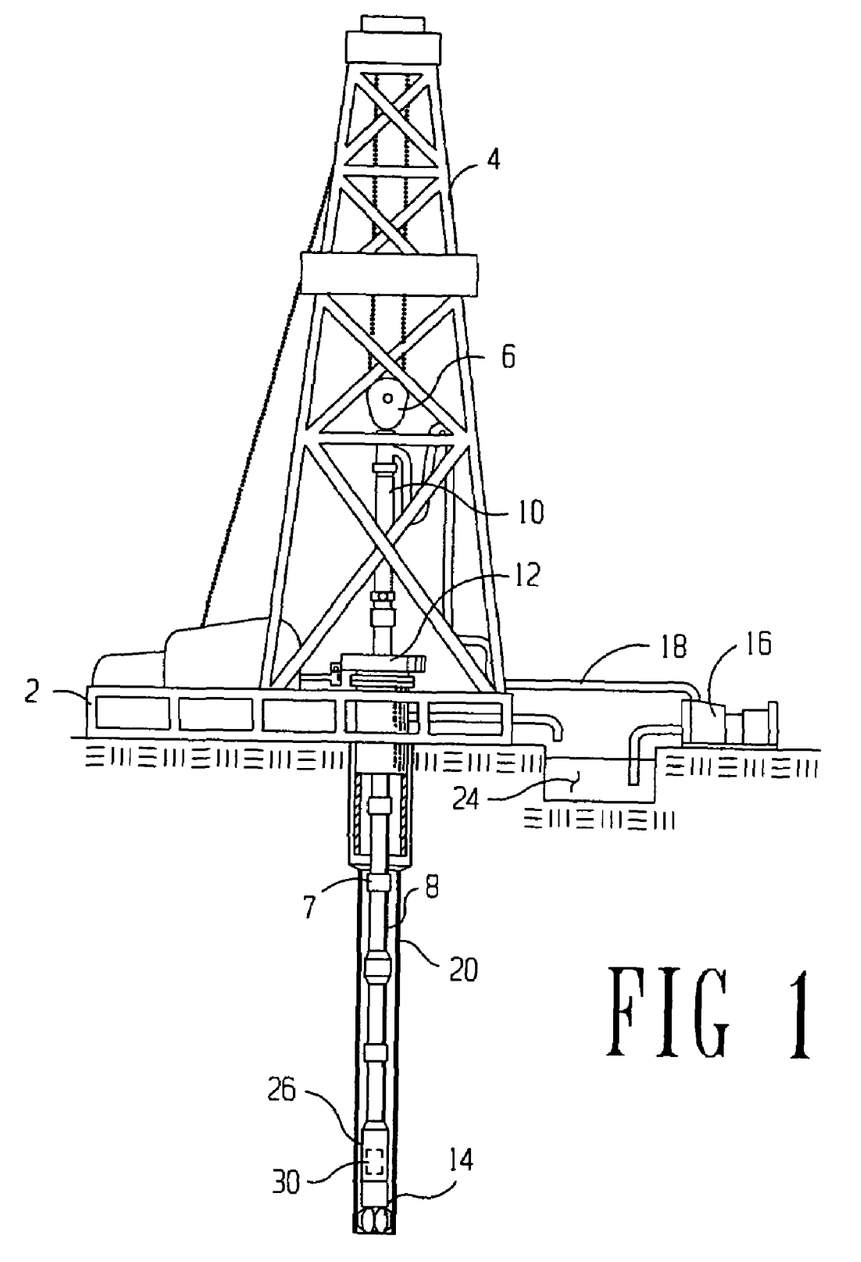
FIG. 1 illustrates a well during drilling operations.

FIG. 1 illustrates a well during drilling operation. A drilling platform 2 may be equipped with a derrick 4 that supports a hoist 6. Drilling of oil and gas wells may be carried out by a string of drill pipes connected together by "tool" joints 7 so as to form a drillstring 8. The hoist 6 suspends a kelly 10 that may be used to lower the drillstring 8 through rotary table 12. A drill bit 14 may be connected to the lower end of the drillstring 8. Bit 14 may be rotated and drilling accomplished by rotating the drillstring 8, the bit 14 may be rotated by use of a downhole motor near the drill bit, or both methods may be used. Drilling fluid, termed "mud," may be pumped by mud recirculation equipment 16 through supply pipe 18, through drilling kelly 10, and down through the drillstring 8 at high pressures and volumes to emerge through nozzles or jets in the drill bit 14. The mud may then travel back up via an annulus formed between the exterior of the drillstring 8 and the borehole wall 20, through a blowout preventer (not specifically shown), and into a mud pit 24 on the surface. A downhole tool 26 comprising a tool body may also be coupled within the drillstring 8, where the downhole tool 26 may be used for LWD.

LWD often involves the measurement of various downhole properties. Sensors or receivers (not specifically shown) may be integrated into the downhole tool 26 such that downhole properties may be measured as the drillstring 8 progresses through the formation. Note that although this disclosure may relate to utilizing the preferred embodiments in a receiver structure, the preferred embodiments may also be implemented with regard to downhole transmitters. Downhole tool 26 may also include a downhole clock 30 that may contain a crystal-based reference with controlled accuracy. Using a time value generated by downhole clock 30, measurements may be time-stamped to indicate the time at which formation interrogation energy was received. The arrival time information of the formation interrogating energy may thus be used to determine formation properties as well as the depth of downhole tool 26. In a specific, but non-limiting example, seismic energy may be imparted to the ground at or near the surface, or possibly in other wellbores proximate to the well being drilled. The total propagation time, as calculated by the difference between the time seismic energy was imparted and the arrival time of the seismic energy may thus be determined, in part, by the time values produced by the downhole clock 30.

Downhole clock 30 may include a plurality of quartz crystals along with accompanying circuitry. The accompanying circuitry may derive time values based on frequencies of oscillation of the various crystals. However, the actual frequencies output by the various crystal oscillators may change with operating conditions such as time, temperature, vibrations, and the like, and thus may cause "uncertainty." The uncertainty of a time base reference refers to range of possible frequencies within which the actual oscillation frequency may fall. For example, if a crystal is expected to oscillate at 10 MHz, and the uncertainty is ±0.01 MHz, then the actual frequency may be between 9.99 MHz and 10.01 MHz.

Uncertainty of the time reference may also be expressed in fractional parts, for example, a crystal may have an uncertainty of 2 parts per million (ppm) or $2 \times 10^{-6}$. Thus, if an oscillator has an expected frequency of 10 MHz with an uncertainty of $2 \times 10^{-6}$, then the actual frequency may be in the range of 9,999,980 Hz to 10,000,020 Hz. Because a crystal's frequency of oscillation may vary depending on operating conditions (temperature, vibration, time, etc.), uncertainty is usually referred to with respect to a particular condition. For example, a 10 MHz crystal may have an uncertainty of 5 ppm/1° C., such that if the crystal experienced a 50° change in temperature, then the actual operating frequency of the crystal may be 10 MHz±2.5 kHz.

Figure 2:
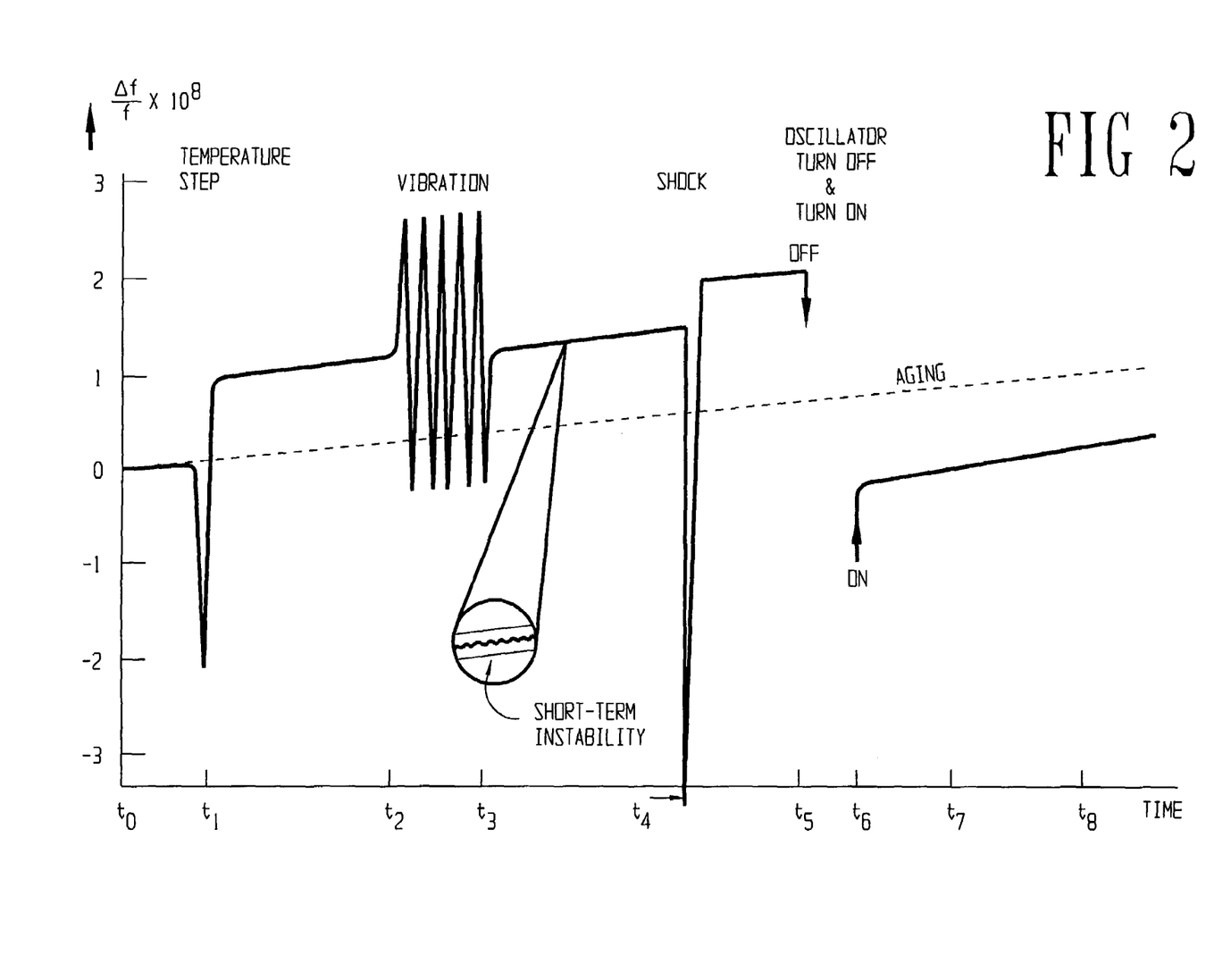
FIG. 2 illustrates various factors that may influence a crystal's oscillation frequency.

FIG. 2 may illustrate factors that may influence changes in a crystal's frequency behavior over time, and is adapted from "Quartz Crystal Resonators and Oscillators," by John R. Vig, January 2001, which is hereby incorporated by reference as if reproduced in full below. At time $t_0$ the crystal may be coupled to accompanying oscillation circuitry and oscillations may begin. The crystal's oscillation frequency may have a long term aging effect as illustrated by the dashed line in FIG. 2, which is sometimes referred to as the "aging curve." Note that although the aging curve in FIG. 2 shows the frequency increasing over time, other scenarios are possible (depending on the crystal) and may include periods of increasing frequency followed periods of decreasing frequency, and vice versa. Time $t_1$ may represent a change in frequency as a result of a change in temperature of the crystal. Note that the crystal may assume a different aging curve that may or may not correlate to a previous aging curve as a result of the temperature step. Time periods between $t_2$ and $t_3$ may indicate change in frequency due to physical vibration of the crystal. Also, short term instability may be shown as a minor contribution to the overall frequency variation. Time period $t_4$ may represent a change in frequency as a result of physical shock to the crystal, which usually is measured in multiples of the force of gravity. A shock to the crystal that may produce noticeable variations in crystal frequency may be on the order of several thousand times the force of gravity. Time period $t_5$ may represent powering-off the oscillator, and time period $t_6$ may represent powering-on of the oscillator. Note that as the oscillator is powered-on, the crystal may assume a different aging curve that may or may not correlate to a previous aging curve. Downhole clock 30 of the preferred embodiments may compensate for, and/or may be implemented to nullify, the conditions that may cause frequency deviations, including temperature.

Figure 3:
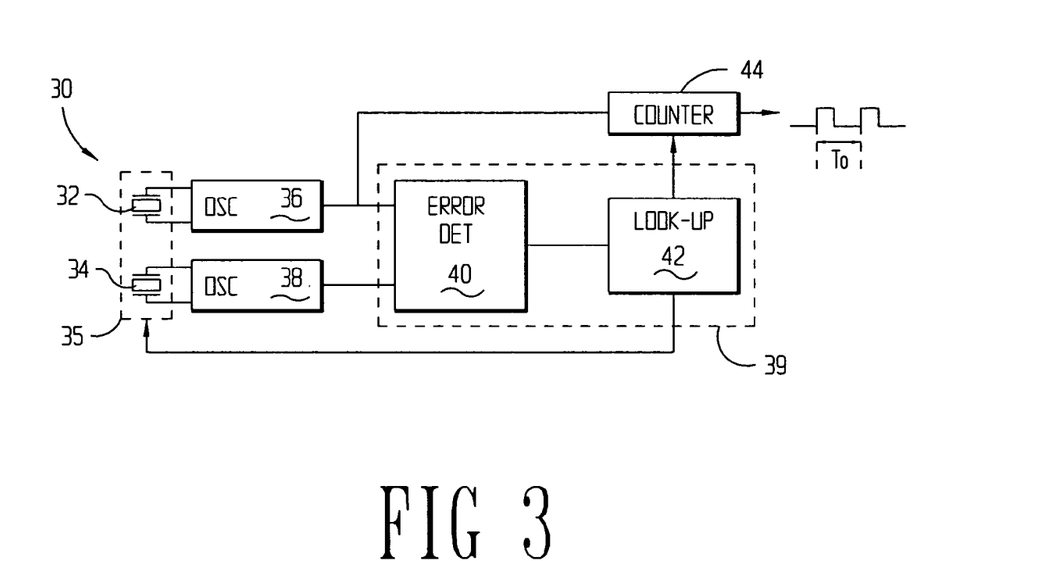
FIG. 3 illustrates a downhole clock according to embodiments of the present invention.

FIG. 3 illustrates embodiments of downhole clock 30 that may have improved temperature behavior. Clock 30 may include two or more crystals 32 and 34. Crystals 32 and 34 may be chosen based upon their behavior with respect to temperature, as will be discussed in detail below. A temperature regulator 35 may be active and/or passive, and may operate to thermally couple crystals 32 and 34 such that they may have substantially the same temperature. Crystals 32 and 34 may be electrically coupled to oscillators 36 and 38 respectively. Oscillators 36 and 38 may generate oscillating signals, where the frequency of the oscillating signals may be related to the physical parameters of the crystals 32 and 34 respectively. The oscillation frequency of oscillator 36 may be used to create a downhole clock signal for time-stamping data measurements.

Referring still to FIG. 3, a temperature correction circuit 39, which in some embodiments may comprise an error detector 40 and a look-up table 42, is shown coupled to the oscillators 36 and 38. Error detector 40 may determine the phase and frequency differences between the signals generated by oscillators 36 and 38. Crystals 32 and 34 may be selected such that they behave differently with respect to temperature variations, and consequently the signals generated by oscillators 36 and 38 may not have the same phase and/or frequency. Prior to deploying the clock 30 downhole, a relationship between the phase/frequency error of the signals and the temperature of the crystals 32 and 34 may be characterized. This relationship may be stored downhole, such as in a look-up table 42 prior to deploying the clock 30.

The temperature indicated by the differing frequencies of oscillation of the crystals 32 and 34 may be coupled to the regulator 35. The regulator 35 may thus utilize the effective temperature measurement of the crystals 32 and 34 to regulate the temperature of the combination of the crystals 32 and 34. Similarly, the counter 44 may utilize the temperature indicated by the differing frequencies of oscillation of the crystals 32 and 34 to produce a clock signal to compensate the frequency of oscillation of oscillator 36 for temperature downhole. The counter 44 may count the frequency generated by oscillator 36 and generate an output pulse after a desired number of counted pulses, where the desired number of count pulses may be termed the "count value N". By a varying the count value N, a clock signal may be produced with a predetermined period $T_0$ as shown. For example, if the actual frequency coming from oscillator 36 is in the range of 9,999,980 Hz to 10,000,020 Hz, then the counter 44 may have a count value N in the range of 9,999,980 to 10,000,020 if a 1 second period $T_0$ is desired, and the resulting clock signal may be used to time-stamp data measurements.

Crystals used for crystal-based oscillators may be pieces of quartz that have been separated from a larger quartz bar. Generally a quartz bar has three axes—i.e., x, y, and z—where each axis corresponds to the atomic lattice structure of the quartz bar rather than its physical dimensions. Additionally, the term "cut" refers to the manner in which the piece of quartz is cut from a quartz bar. By separating or "cutting" the quartz bar at various angles with respect to each of the axes, individual crystals may be made with varying characteristics. Certain crystal cuts may have superior behavior with respect to certain operating conditions. For example, an SC-cut type crystal may have superior thermal characteristics compared to other crystal cuts, such as an AT-cut type crystal.

Figure 4:
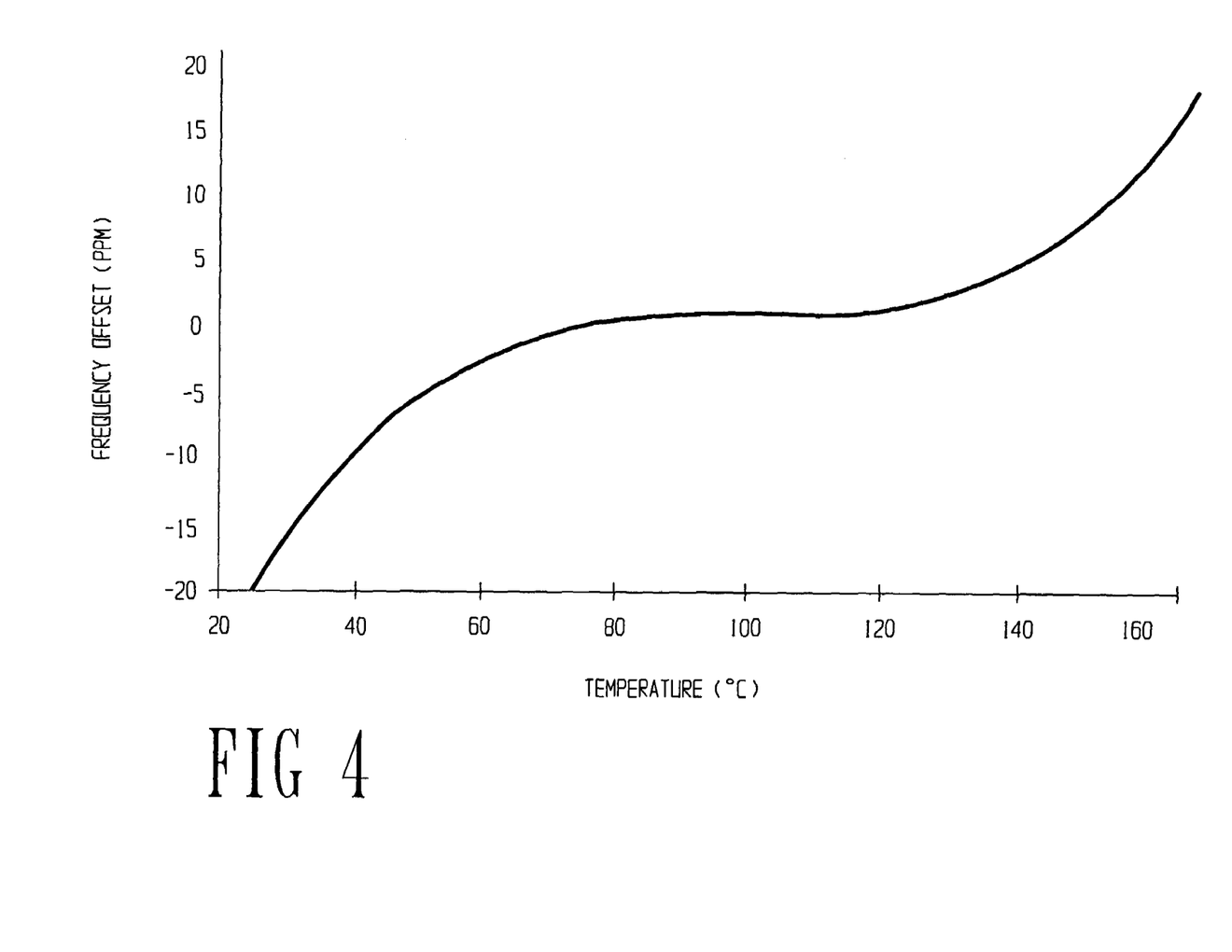
FIG. 4 illustrates the frequency deviations resulting from temperature changes for an SC-cut crystal.

FIG. 4 illustrates the frequency variation (y-axis) versus temperature x-axis) of an exemplary SC-cut crystal. Although exact numerical values associated with the graph shown in FIG. 4 may vary among SC-cut crystals, the overall behavior demonstrated by FIG. 4 may be similar among various SC-cut crystals. As indicated in FIG. 4, SC-cut crystals may operate over a range of temperatures where the frequency variation due to temperature may be negligible. For example, FIG. 4 illustrates that from about 80° to about 110° C. there is only an amount of frequency variation. Other crystal cuts—e.g., the AT, BT, and LC cuts—may have frequency variations with respect to temperature that are significantly greater than the SC-cut. By implementing crystals 32 and 34 using different crystal cuts, their behavior with respect to temperature may be advantageously used to produce a downhole clock that is substantially insensitive to temperature.

Referring again to FIG. 3, crystal 32 may comprise a crystal with a small frequency deviation with respect to temperature, such as an SC-cut crystal, whereas crystal 34 may include a crystal with a frequency deviation with respect to temperature that is greater than that of crystal 32, such as an AT-cut crystal. Because crystal 32 may be capable of sustaining a frequency that is substantially stable with respect to temperature in a particular range of temperatures, it may be referred to as the stable crystal 32. Likewise, because crystal 34 may have a frequency of oscillation that varies with respect to temperature in the particular range, it may be referred to as the variable crystal 34. Although the variable crystal 34 may vary with respect to temperature, its behavior may be known and advantageously used to determine the temperature of the crystals 32 and 34. The temperature determined may be used to compensate for frequency deviations of crystal 32 caused by temperature variations. Regulator 35 may maintain both the stable crystal 32 and the variable crystal 34 at substantially the same temperature.

In some embodiments, the temperature at which the regulator 35 attempts to maintain the crystals may be in the range where the stable crystal 32 has small frequency deviation as a function of temperature (see FIG. 4). For example, if the stable crystal 32 is an SC-cut crystal with properties as shown in FIG. 4, then the regulator 35 may maintain crystals 32 and 34 in the range of about 80° to about 110° C.

Figure 5A:
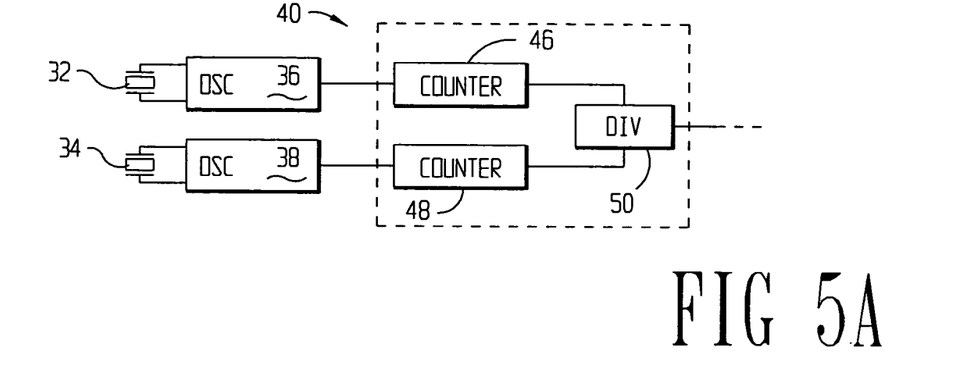
FIG. 5A illustrates an exemplary embodiment for an error detector according to the embodiments of the present invention.
Figure 5B:
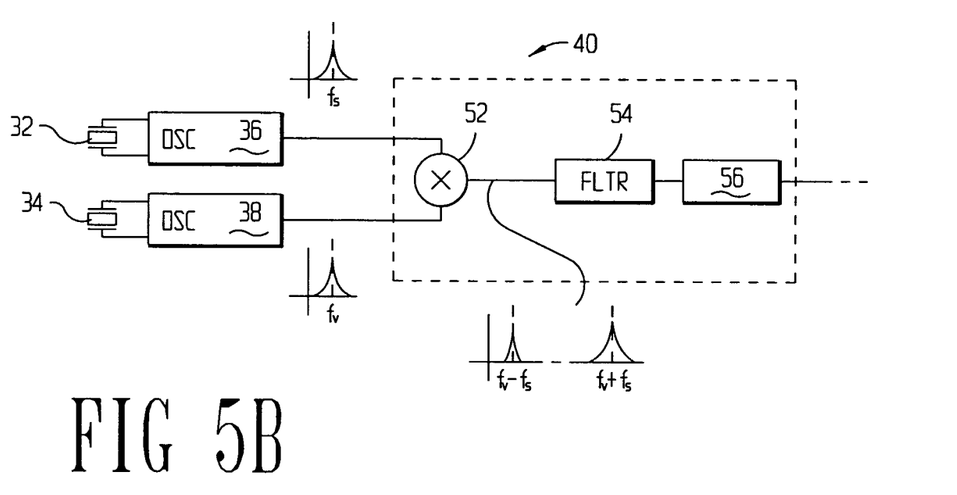
FIG. 5B illustrates another exemplary embodiment of an error detector according to the embodiments of the present invention.

Although temperature of the crystals may be controlled to some extent by the regulator 35, some temperature fluctuation may be experienced. While crystal 32 may have only small frequency changes as a function of temperature, the changes may be present none-the-less. Embodiments of the invention may thus use the frequency of oscillation of crystal 34 to determine a temperature of the crystals, and to compensate the oscillatory frequency of crystal 32 for temperature, even within the controlled range. Thus, the frequency behavior of crystals 32 and 34 may be compared, using the error detector 40, to determine their relationship to each other with respect to temperature. FIGS. 5A–5B illustrate various embodiments of the error detector 40. Referring to FIG. 5A, the error detector 40, in one embodiment, may include a first counter 46 coupled to oscillator 36, and a second counter 48 coupled to oscillator 38. Counters 46 and 48 may contain count values that indicate the oscillation frequencies of oscillators 36 and 38 respectively. With oscillator 36 coupled to the stable crystal 32, and oscillator 38 coupled to the variable crystal 34, differences between their frequencies, for example due to temperature, may be determined. The count values from counters 46 and 48 may be compared using divider 50. The comparison may be a continuous comparison, or it may occur at predetermined intervals of time. Divider 50 may produce an error measurement based on the ratio of the count values of counters 46 and 48. For example, oscillator 36 may produce a 10 MHz signal that is stable over a temperature range from 80° to 110° C., and oscillator 38 may produce a 10 MHz±0.5 kHz over the same temperature range. If the counters 46 and 48 count each of these respective frequencies for 1 millisecond, then the count value of counter 46 may be 10,000 while the count value of counter 48 may be between 9,999.5 and 10,000.5 depending on the temperature of crystal 34. By dividing the count value from counter 46 by the count value from counter 48, divider 50 then may produce a divide ratio range between 0.9995 and 1.0005, where this divide ratio range may correspond to the temperature range of 80° to 110° C. As temperatures depart from this range a different divide ratio may be used. Thus, there may be a relationship between the divide ratio and the temperature, and this relationship may be determined and stored in the table 42 prior to deploying the clock 30 downhole.

FIG. 5B shows yet another embodiment of the error detector 40 having a frequency mixer 52 coupled to a filter 54. The mixer 52 may be coupled to oscillators 36 and 38. Oscillator 36 may provide a stable frequency ($f_s$) with respect to temperature. Oscillator 38 may provide a variable frequency ($f_v$) with respect to temperature. The mixer 52 may produce a mixed version of the frequencies that may include the sum of the two frequencies ($f_v+f_s$) and the difference between the two frequencies ($f_v-f_s$) as indicated in FIG. 5B. Filter 54 may comprise a low-pass filter, capable of removing frequencies above $f_v-f_s$, and providing $f_v-f_s$ to a spectrum analyzer 56. The spectrum analyzer 56 may provide the spectral content of the difference signal $f_v-f_s$ by performing an inverse Fourier transform. As the temperature changes, the value of $f_v-f_s$ may change, and consequently the spectral content of $f_v-f_s$ may also change. Accordingly, this relationship may be characterized and stored in the table 42 prior to deploying the clock 30 downhole so that the downhole temperature may be determined and the clock signal may be adjusted to compensate for downhole temperatures.

Figure 5C:
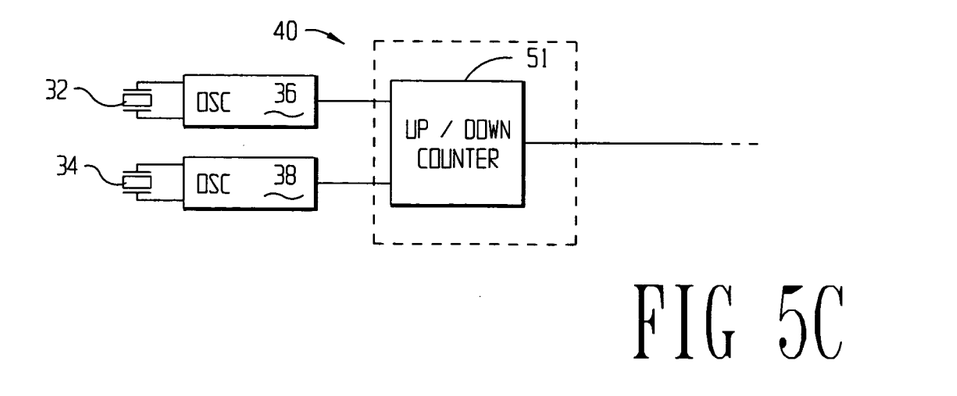
FIG. 5C illustrates yet another exemplary embodiment of an error detector according to the embodiments of the present invention.

Referring to FIG. 5C, another embodiment of error detector 40 is shown. As shown, an up/down counter may be utilized, where oscillator 36 may generate an up count, and oscillator 38 may generate a down count. Accordingly, the net count value may be indicative of the temperature of the crystals.

Referring again to FIG. 3, oscillators 36 and 38 may include circuitry capable of sustaining oscillations based on crystals 32 and 34. Table 42 may contain a list of temperatures along with the corresponding frequencies coming from oscillators 32 and 34 at those temperatures. The corresponding frequencies contained in table 42 may be determined from the ratio of divider 50, the spectral content coming from filter 54, or any other device capable of establishing a relationship between the stable frequency and the variable frequency with respect to changes in temperature. The look-up table 42 may include processing circuitry (not specifically shown in FIG. 3), so that the frequency versus temperature information in table 42 may be provided to the regulator 35 and/or the counter 44 in appropriate format respectively. For example, the regulator 35 may be provided with an analog voltage by table 42, whereas counter 44 may be provided with a digital value by table 42.

The difference between the frequency based on crystal 32 and the frequency based on crystal 34 may be determined using the error detector 40 and the table 42 may provide compensation to the counter 44, where the compensation is related to the temperature of the crystals 32 and 34. In this manner, the clock value produced by counter 44 may be adjusted to provide a predetermined period regardless of temperature. Also, because two crystals are used, each crystal has a frequency-to-temperature relationship that is independent of the other crystal. Therefore individual crystals may be selected such that the difference between the frequency-to-temperature relationships may be maximized and the sensitivity of the system to changes in temperature may be greater than in a single crystal solution.

Figure 6:
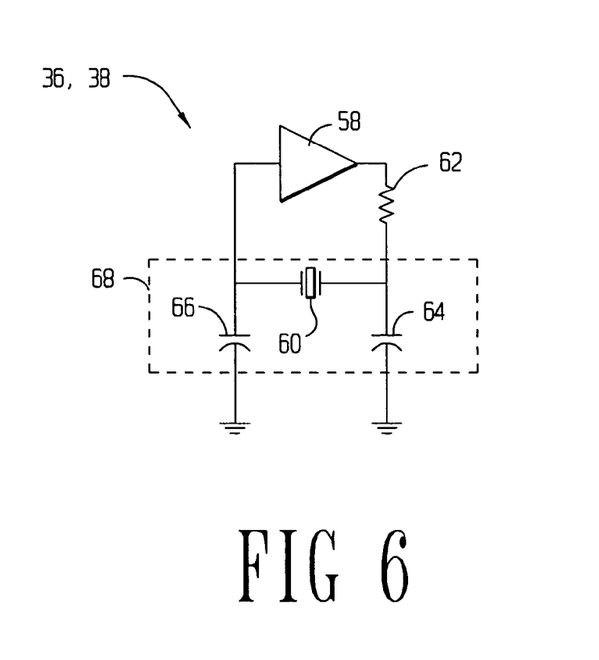
FIG. 6 illustrates an exemplary oscillator structure according to embodiments of the present invention.

FIG. 6 depicts one possible implementation of the crystal-based oscillators 36 and 38. The configuration illustrated in FIG. 6 may be known as a Pierce-type oscillator. In particular, a gain stage 58 may be coupled to a crystal 60 (which may be crystals 32 or 34 shown in FIG. 3). One terminal of crystal 60 may be coupled to the output of gain stage 58 through resistor 62, while the other terminal of the crystal 60 may be coupled to the input of gain stage 58. The crystal 60 may also have both terminals coupled to ground through capacitors 64 and 66.

Operation of oscillators shown in FIG. 6 may be predicted by the Barkhausen criteria, which generally states that oscillation will occur when the magnitude of the loop gain is greater than or equal to unity, while the total phase shift around the loop is a multiple of 360°. The gain stage 58 may be an inverter so that as a signal travels from input to output of gain stage 58, gain may be provided along with 180° of phase shift. A resonator 68 may be formed by capacitors 64 and 66, along with crystal 60, and may provide the additional phase shift required to establish oscillation. Resistor 62 may be provided to establish a minor amount of start-up current for resonator 68.

Because gain stage 58 may provide 180° of phase shift, the resonator 68 may provide an additional 180° to establish oscillation. The frequency at which the resonator 68 provides the added phase shift determines the oscillation frequency of oscillators 36 and 38 and may be controlled by the frequency characteristics of crystal 60. Capacitors 64 and 66 also may have variable values so that slight adjustments to the frequencies produced by oscillators 36 and 38 may be made if so desired. The specification to this point has focused on circuit designs of the various embodiments of the invention; however, and as at least alluded to above, various embodiments may also implement certain mechanical arrangements of the crystals and related structures.

Figure 7A:
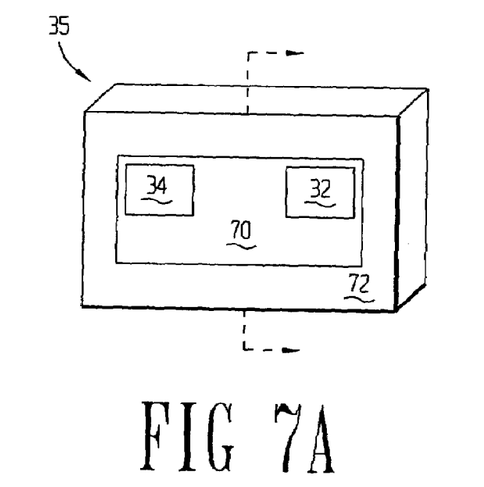
FIG. 7A illustrates an exemplary embodiment of a regulator structure according to the embodiments of the present invention.
Figure 7B:
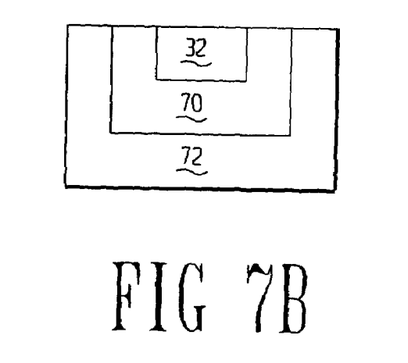
FIG. 7B illustrates a cross-section of the exemplary regulator of FIG. 7A.

In order for the clock 30 to provide accurate measurements, crystals 32 and 34 should be at substantially the same temperature. In embodiments of the invention, this may be accomplished by thermally coupling crystals 32 and 34, for example by physically coupling the crystals to a heat sink, as well as maintaining temperature of the crystals with temperature regulator 35. Temperature regulator 35 may maintain crystals 32 and 34 at substantially the same temperature in an active manner—i.e., using some type of heating/cooling element—or in a passive manner—i.e., without the use of a heating element. FIG. 7A shows a possible implementation of the temperature regulator 35, and FIG. 7B shows a cross section of the regulator 35, as indicated by the arrows in FIG. 7A. Referring to FIGS. 7A and 7B, the stable and variable crystals 32 and 34 may be incorporated into a heat sink 70. Heat sink 70 may be any material, but preferably copper, that promotes minimal temperature gradient between crystals 32 and 34. In addition, heat sink 70 may include materials with desired phase change properties as described below. Heat sink 70 may passively maintain the crystals 32 and 34 at substantially the same temperature. A heating/cooling module 72 may be coupled to the heat sink 70. The heating/cooling device 72 may be of any suitable type for maintaining the heat sink 70 and the crystals 32 and 34 at a predetermined temperature, such as in the range of temperatures for which the stable crystal 32 has only small frequency deviations as a function of temperature. In this manner, heating/cooling module 72 may actively maintain the crystals 32 and 34 at substantially the same temperature using feedback from table 42. For example, the heating/cooling module 72 may be a Peltier-type solid state cooler. Alternatively, although regulator 35 is shown in FIGS. 7A and 7B including a heating/cooling module 72, in some embodiments, the heating/cooling module 72 may be omitted and yet the crystals 32 and 34 may be maintained at substantially the same temperature by heat sink 70. Also, although not specifically show in FIGS. 7A and 7B, the regulator 35 may include foil-type insulation around the heat sink 70.

Figure 8:
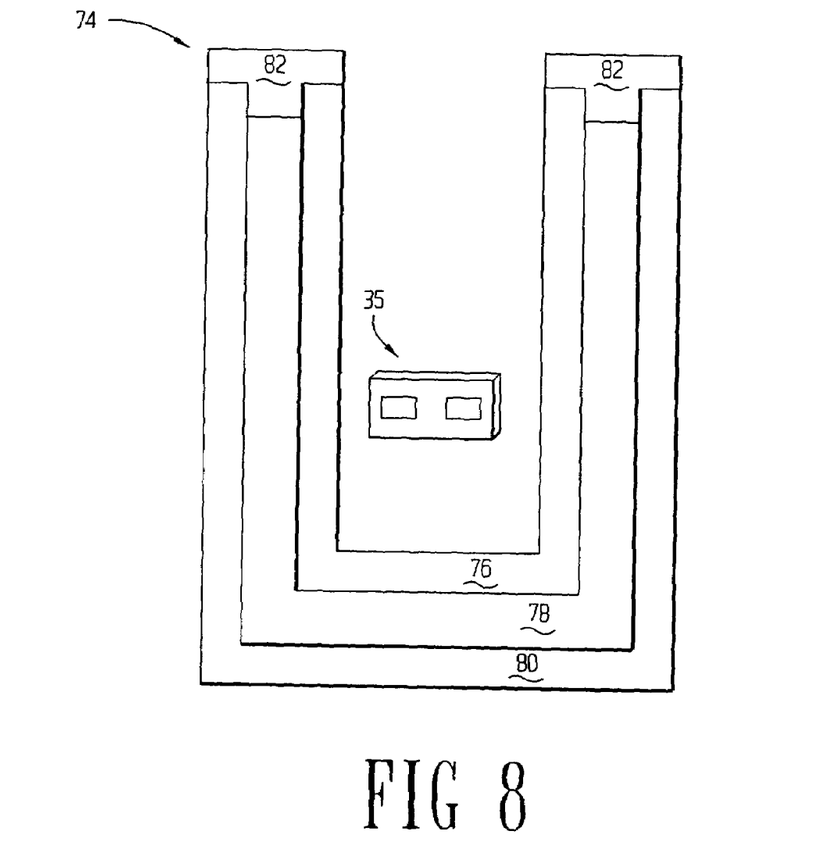
FIG. 8 illustrates an exemplary representation of a flask according to the embodiments of the present invention.

Other methods may be employed to assist in maintaining the crystals 32 and 34 within a desired temperature range. FIG. 8 shows a cross-section of a flask 74, which may contain regulator 35 shown in FIG. 7A. Flask 74 may include multiple insulating liners such as a first liner 76 and a second liner 80. A cavity 78 between the liners 76 and 80 may include any type of material that slows heat transfer. For example, the cavity 78 between liners 76 and 80 may be a vacuum so as to impede heat transfer by convection. In addition, cavity 78 may include layers of reflective material and/or mirroring surfaces so as to impede heat transfer by radiation. Caps 82 may be used to contain the vacuum state and/or the material in the cavity 78. The embodiments of FIGS. 7A, 7B, and 8 may allow the temperature gradient between the stable crystal 32 and the variable crystal 34 to be minimized.

Furthermore, heat sink 70 may be surrounded with a phase change material that may maintain a constant temperature as the material undergoes a phase change (e.g., solid to liquid, liquid to gas, etc.). For example, the phase change material may include sodium phosphate, barium hydro-oxide, as wells as eutectic alloys such as CerroBEND®. In changing phases, the energy required to effectuate the change in phase may be absorbed from the flask 74. Accordingly, the temperature at which the phase change occurs may plateau, and a desired material may be chosen such that the temperature plateau is in the desired temperature range of the stable crystal 32.

Numerous other variations and modifications will become apparent to those skilled in the art once the above disclosure is fully appreciated. For example, in some embodiments, the variable crystal 34 may include an LC-cut crystal which may have linear frequency deviations with respect to temperature. It is intended that the following claims be interpreted to embrace all such variations and modifications.

What is claimed is:

1. A downhole clock source, comprising:
   a first crystal and a second crystal, wherein the first and second crystals are thermally coupled together;
   a first oscillator coupled to the first crystal, and a second oscillator coupled to the second crystal, wherein the first oscillator generates a first signal associated with the first crystal, and the second oscillator generates a second signal associated with the second crystal, each of the signals having a frequency, wherein frequency change of the first signal with respect to temperature of the crystals is different than the frequency change of the second signal with respect to the temperature of the crystals;
   a mixer coupled to the first and second oscillators, wherein the mixer generates a difference signal representing the difference between the first and second signals as the temperature varies; and
   a spectrum analyzer coupled to the mixer, wherein the spectrum analyzer provides a spectral analysis of the difference signal.

2. The downhole clock source of claim 1, further comprising a temperature correction circuit coupled to the first and second oscillators, and wherein the temperature correction circuit determines the temperature of the crystals based on a relationship between the frequency of the first signal and the frequency of the second signal.

3. The downhole clock source of claim 2, wherein the temperature correction circuit further comprises a storage device, wherein a frequency behavior of the first and second signals with respect to temperature is stored in the storage device.

4. The downhole clock source of claim 3, wherein frequency behavior with respect to temperature is stored prior to deployment downhole.

5. The downhole clock source of claim 2, wherein the frequency of the first signal is temperature compensated according to the temperature of the crystals.

6. The downhole clock source of claim 5, further comprising a counter coupled to the first oscillator, wherein the counter may be adjusted using information from the storage device to produce a clock signal having a predetermined period regardless of temperature of the crystals.

7. A method comprising:
   thermally coupling a first crystal and a second crystal by way of a thermally conductive material;
   generating a first signal based on a frequency of oscillation of the first crystal;
   generating a second signal based on a frequency of oscillation of the second crystal, wherein the first signal's frequency change with respect to temperature is different than the second signal's frequency change with respect to temperature;
   determining a temperature of the first and second crystals based on a relationship between a frequency change of the second crystal with respect to temperature, the determining a temperature by:
mixing the first and second signal to produce a sum signal and a difference signal;
analyzing, spectrally, the difference signal; and
wherein the spectral content of the difference signal as proportional to the temperature of the crystals.

8. The method of claim 7, further comprising storing an indication of the frequency behavior of the first and second crystals with respect to temperature in a storage device.

9. The method of claim 8, wherein the storing occurs prior to deployment downhole.

10. The method of claim 7, further comprising compensating the first signal's frequency according to the temperature of the crystals.

11. The method of claim 7, further comprising maintaining the temperature of the crystals within a range of predetermined temperatures.

12. The method of claim 11, wherein maintaining the temperature of the crystals further comprises maintaining the temperature of the crystals within a range of temperatures over which the first signal's frequency is substantially stable with respect to temperature.

13. The method as defined in claim 7 further comprising filtering the sum signal.

14. A method comprising:
thermally coupling a first crystal and a second crystal;
generating a first signal based on a frequency of oscillation of the first crystal;
generating a second signal based on a frequency of oscillation of the second crystal, wherein the first signal's frequency is more stable, with respect to temperature, than the second signal's frequency;
determining a temperature of the first and second crystal based on a relationship between a frequency behavior of the second crystal with respect to temperature, the determining by:
maintaining a first count value proportional to the first signal's frequency;
maintaining a second count value proportional to the second signal's frequency;
calculating a ratio of the first and second count value, wherein the ratio of the first and second count values is proportional to the temperature of the crystals.

15. A method comprising:
thermally coupling a first crystal and a second crystal;
generating a first signal based on a frequency of oscillation of the first crystal;
generating a second signal based on s frequency of oscillation of the second crystal, wherein the first signal's frequency is more stable, with respect to temperature, than the second signal's frequency;
determining a temperature of the first and second crystal based on a relationship between a frequency behavior of the second crystal with respect to temperature, the determining by:
maintaining a count value with a single counter;
modifying the count value in a first direction proportional to the first signal's frequency;
modifying the count value in a second direction proportional to the second signal's frequency; and
wherein the net count value is proportional to the temperature of the crystals.

16. The method of claim 15, further comprising:
wherein modifying the count value in the first direction further comprises incrementing the count value; and
wherein modifying the count value in the second direction further comprises decrementing the count value.

17. The method of claim 15, further comprising compensating the first signal's frequency according to the temperature of the crystals.

18. A method comprising:
determining an operating temperature of a first crystal based on a difference in frequency between a signal generated based on the first crystal and a signal generated based on a second crystal that is thermally coupled to the first crystal, the determining by:
generating a first signal based on a frequency of oscillation of the first crystal;
generating a second signal based on a frequency of oscillation of the second crystal, wherein the first signal's frequency is more stable, with respect to temperature, than the second signal's frequency;
mixing the first and second signal to produce a sum signal and a difference signal;
filtering out the sum signal; and
analyzing, spectrally, the difference signal;
wherein the spectral content of the difference signal is proportional to the temperature of the crystals.

19. The method as defined in claim 18, further comprising adjusting a clock signal generated based on the first crystal for frequency variations of the first crystal related to the operating temperature.

20. A method comprising:
determining an operating temperature of a first crystal based on a difference in frequency between a signal generated based on the first crystal and a signal generated based on a second crystal that is thermally coupled to the first crystal, the determining by:
generating a first signal based on a frequency of oscillation of the first crystal;
generating a second signal based on a frequency of oscillation of the second crystal, wherein the first signal's frequency is more stable, with respect to temperature, than the second signal's frequency;
maintaining a first count value proportional to the first signal's frequency;
maintaining a second count value proportional to the second signal's frequency;
calculating a ratio of the first and second count value, wherein the ratio of the first and second count values is proportional to the temperature of the crystals.

21. The method of claim 20, further comprising compensating the first signal's frequency according to the temperature of the crystals.

22. A method comprising:
determining an operating temperature of a first crystal based on a difference in frequency beiween a signal generated based on the first crystal and a signal generated based on a second crystal that is thermally coupled to the first crystal, the determining by:
maintaining a count value with a single counter;
modifying the count value in a first direction proportional to the first signals frequency;
modifying in the count value in a second direction proportional to the second signal's frequency; and
wherein the net count value is proportional to the temperature of the crystals.

23. The method of claim 22, further comprising:
wherein modifying the count value in the first direction further comprises incrementing the count value; and
wherein modifying the count value in the second direction further comprises decrementing the count value.

* * * * *